(12) United States Patent
Khlat (10) Patent No.: US 10,985,731 B2
(45) Date of Patent: Apr. 20, 2021

(54) ACOUSTIC RESONATOR STRUCTURE

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/358,913

(22) Filed: Mar. 20, 2019

(65) Prior Publication Data

US 2020/0099362 A1 Mar. 26, 2020

Related U.S. Application Data

(60) Provisional application No. 62/733,703, filed on Sep. 20, 2018.

(51) Int. Cl.
| | | |
|---|---|---|
| *H03H 9/02* | (2006.01) | |
| *H03H 9/54* | (2006.01) | |
| *H03H 7/01* | (2006.01) | |
| *H03H 9/64* | (2006.01) | |

(52) U.S. Cl.
CPC .......... *H03H 9/542* (2013.01); *H03H 7/0161* (2013.01); *H03H 9/02007* (2013.01); *H03H 9/545* (2013.01); *H03H 9/64* (2013.01)

(58) Field of Classification Search
CPC .. H03H 9/54; H03H 9/60; H03H 9/64; H03H 9/02
See application file for complete search history.

(56) References Cited

U.S. PATENT DOCUMENTS

| | | | |
|---|---|---|---|
| 6,246,153 B1 | 6/2001 | Bishop et al. | |
| 6,671,016 B1 | 12/2003 | Kim | |
| 7,333,831 B2 | 2/2008 | Srinivasan et al. | |
| 7,459,990 B2 | 12/2008 | Wunnicke et al. | |
| 7,515,018 B2 | 4/2009 | Handtmann et al. | |
| 8,026,776 B2 | 9/2011 | Ueda et al. | |
| 9,985,605 B2 | 5/2018 | Tani et al. | |
| 10,284,174 B2 | 5/2019 | Khlat et al. | |
| 2008/0055020 A1 | 3/2008 | Handtmann et al. | |

(Continued)

OTHER PUBLICATIONS

Non-Final Office Action for U.S. Appl. No. 16/387,940, dated Sep. 26, 2019, 10 pages.

(Continued)

*Primary Examiner* — Dean O Takaoka (74) *Attorney, Agent, or Firm* — Withrow & Terranova, P.L.L.C.

(57) ABSTRACT

An acoustic resonator structure is provided. The acoustic resonator structure includes an acoustic resonator configured to resonate in a resonance frequency to pass a radio frequency (RF) signal from an input node to an output node. However, the acoustic resonator may create an electrical capacitance in parallel to the acoustic resonator. The electrical capacitance may cause the acoustic resonator to resonate outside the resonance frequency, thus compromising performance of the acoustic resonator. In this regard, an active circuit is provided in parallel to the acoustic resonator in the acoustic resonator structure. The active circuit can be configured to cause a negative capacitance between the input node and the output node. As such, it may be possible to cancel the electrical capacitance created by the acoustic resonator, thus helping to improve performance of the acoustic resonator.

19 Claims, 6 Drawing Sheets

(56) References Cited

U.S. PATENT DOCUMENTS

| | | |
|---|---|---|
| 2009/0273415 A1 | 11/2009 | Frank et al. |
| 2017/0093370 A1* | 3/2017 | Khlat .................. H03H 9/0004 |
| 2018/0019731 A1 | 1/2018 | Tsukamoto et al. |
| 2020/0099360 A1 | 3/2020 | Khlat |
| 2020/0099363 A1 | 3/2020 | Khlat |
| 2020/0099364 A1 | 3/2020 | Khlat |

OTHER PUBLICATIONS

Notice of Allowance for U.S. Appl. No. 16/387,940, dated Jan. 21, 2020, 7 pages.

Karasawa, Rei, et al., "c-Axis zig-zag polarization inverted ScAlN multilayer for FBAR transformer rectifying antenna," IEEE International Ultrasonics Symposium, 2017, Washington, DC, 4 pages.

Larson, John, et al., "Characterization of Reversed c-axis AlN Thin Films," IEEE International Ultrasonics Symposium, San Diego, California, 2010, pp. 1054-1059.

Sussman-Fort, Stephen, "Matching Network Design Using Non-Foster Impedances," Antenna Products and Technologies, EDO Electronic Systems Group, ieee.li/pdf/viewgraphs/matching_network_design_non_foster_impedances, accessed Sep. 10, 2019, Bohemia, New York, 43 pages.

U.S. Appl. No. 16/356,279, filed Mar. 20, 2019.

Non-Final Office Action for U.S. Appl. No. 16/358,913, dated Jun. 9, 2020, 6 pages.

Notice of Allowance for U.S. Appl. No. 16/358,913, dated Nov. 16, 2020, 7 pages.

\* cited by examiner

ACOUSTIC RESONATOR STRUCTURE

RELATED APPLICATIONS

This application claims the benefit of U.S. provisional patent application Ser. No. 62/733,703, filed on Sep. 20, 2018, the disclosure of which is incorporated herein by reference in its entirety.

FIELD OF THE DISCLOSURE

The technology of the disclosure relates generally to an acoustic resonator(s)/filter(s).

BACKGROUND

Wireless devices have become increasingly common in current society. The prevalence of these wireless devices is driven in part by the many functions that are now enabled on such devices for supporting a variety of applications. In this regard, a wireless device may employ a variety of circuits and/or components (e.g., filters, transceivers, antennas, and so on) to support different numbers and/or types of applications. Accordingly, the wireless device may include a number of switches to enable dynamic and flexible couplings between the variety of circuits and/or components.

Acoustic resonators, such as surface acoustic wave (SAW) resonators and bulk acoustic save (BAW) resonators, are used in many high-frequency communication applications. In particular, SAW resonators are often employed in filter networks that operate frequencies up to 1.8 GHz, and BAW resonators are often employed in filter networks that operate at frequencies above 1.5 GHz. Such filters need to have flat passbands, have steep filter skirts and squared shoulders at the upper and lower ends of the passband, and provide excellent rejection outside of the passband. SAW and BAW-based filters also have relatively low insertion loss, tend to decrease in size as the frequency of operation increases, and are relatively stable over wide temperature ranges.

As such, SAW and BAW-based filters are the filters of choice for many 3rd Generation (3G) and 4th Generation (4G) wireless devices and are destined to dominate filter applications for 5th Generation (5G) wireless devices. Most of these wireless devices support cellular, wireless fidelity (Wi-Fi), Bluetooth, and/or near field communications on the same wireless device and, as such, pose extremely challenging filtering demands. While these demands keep raising the complexity of wireless devices, there is a constant need to improve the performance of acoustic resonators and filters that are based thereon.

SUMMARY

Aspects disclosed in the detailed description include an acoustic resonator structure. The acoustic resonator structure includes an acoustic resonator configured to resonate in a resonance frequency to pass a radio frequency (RF) signal from an input node to an output node. However, the acoustic resonator may create an electrical capacitance in parallel to the acoustic resonator. The electrical capacitance may cause the acoustic resonator to resonate outside the resonance frequency, thus compromising performance of the acoustic resonator. In this regard, an active circuit is provided in parallel to the acoustic resonator in the acoustic resonator structure. The active circuit can be configured to cause a negative capacitance between the input node and the output node. As such, it may be possible to cancel the electrical capacitance created by the acoustic resonator, thus helping to improve performance of the acoustic resonator.

In one aspect, an acoustic resonator structure is provided. The acoustic resonator structure includes an input node and an output node. The acoustic resonator structure also includes an acoustic resonator coupled between the input node and the output node. The acoustic resonator is configured to resonate in a resonance frequency to pass an RF signal from the input node to the output node. The acoustic resonator structure also includes an active circuit coupled in parallel to the acoustic resonator. The active circuit is configured to cause a negative capacitance being generated between the input node and the output node.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these terms should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an acoustic resonator structure. The acoustic resonator structure includes an acoustic resonator configured to resonate in a resonance frequency to pass a radio frequency (RF) signal from an input node to an output node. However, the acoustic resonator may create an electrical capacitance in parallel to the acoustic resonator. The electrical capacitance may cause the acoustic resonator to resonate outside the resonance frequency, thus compromising performance of the acoustic resonator. In this regard, an active circuit is provided in parallel to the acoustic resonator in the acoustic resonator structure. The active circuit can be configured to cause a negative capacitance between the input node and the output node. As such, it may be possible to cancel the electrical capacitance created by the acoustic resonator, thus helping to improve performance of the acoustic resonator.

Figure 1A:
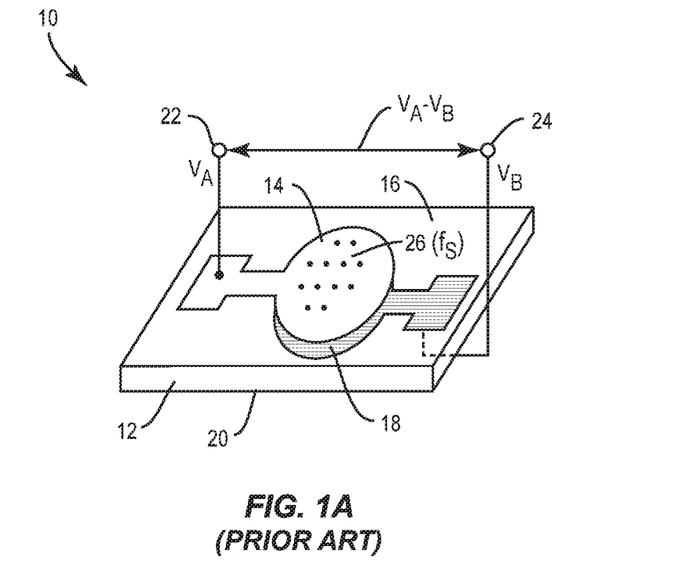
FIG. 1A is a schematic diagram of an exemplary bulk acoustic wave (BAW) resonator.
Figure 1B:
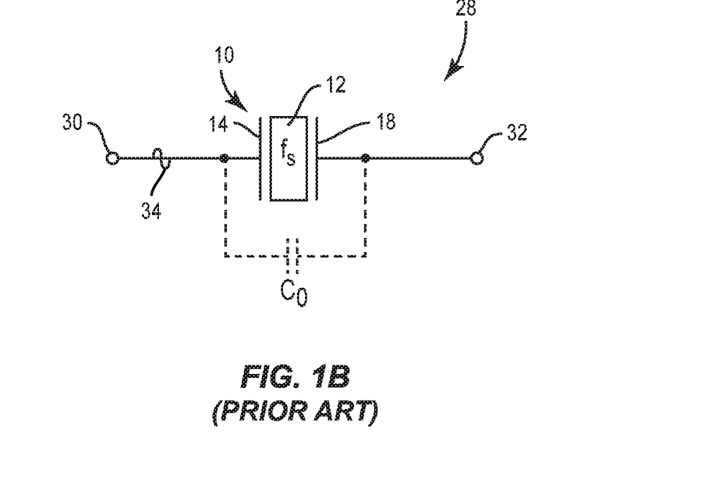
FIG. 1B is a schematic diagram of a radio frequency (RF) filter configured based on the BAW resonator of FIG. 1A.

Before discussing an acoustic resonator structure of the present disclosure, a brief overview of a bulk acoustic wave (BAW) resonator, which may cause an electrical capacitance in parallel to the BAW resonator, is first provided with reference to FIGS. 1A and 1B. The discussion of specific exemplary aspects of the acoustic resonator structure of the present disclosure starts below with reference to FIG. 2A.

FIG. 1A is a schematic diagram of an exemplary BAW resonator 10.

The BAW resonator 10 includes a piezo layer 12 (e.g., a quartz crystal), a top metal electrode 14 disposed on a top surface 16 of the piezo layer 12, and a bottom metal electrode 18 disposed on a bottom surface 20 of the piezo layer 12. When a first voltage $V_A$ and a second voltage $V_B$ are applied to a top electrical port 22 and a bottom electrical port 24, respectively, an acoustic wave 26 is excited and resonates in a resonance frequency ($f_S$) between the top surface 16 and the bottom surface 20 of the piezo layer 12. The resonance frequency ($f_S$) may be related to a thickness of the piezo layer 12 and/or a mass of the top metal electrode 14 and the bottom metal electrode 18.

The BAW resonator 10 can be configured to function as an RF filter in an RF circuit. In this regard, FIG. 1B is a schematic diagram of an RF filter 28 configured based on the BAW resonator 10 of FIG. 1A. Common elements between FIGS. 1A and 1B are shown therein with common element numbers and will not be re-described herein.

In the RF filter 28, the BAW resonator 10 may be provided between an input port 30 and an output port 32. When the BAW resonator 10 resonates in the resonance frequency ($f_s$), the BAW resonator 10 functions as a short circuit to pass an RF signal 34 from the input port 30 to the output port 32. In contrast, the BAW resonator 10 functions as an open circuit to block the RF signal 34 outside the resonance frequency. As such, a respective bandwidth of the resonance frequency ($f_s$) determines a passband bandwidth of the RF filter 28.

However, the top metal electrode 14 and the bottom metal electrode 18 in the BAW resonator 10 may create an electrical capacitance $C_0$ outside the first frequency ($f_S$). Notably, the electrical capacitance $C_0$ can cause the BAW resonator 10 to resonate at a secondary frequency different from the resonance frequency. Consequently, the RF filter 28 may not be able to effectively reject the RF signal 34 outside the resonance frequency ($f_s$), thus compromising performance of the RF filter 28. As such, it may be desired to eliminate the electrical capacitance $C_0$ presented by the BAW resonator 10.

Figure 2A:
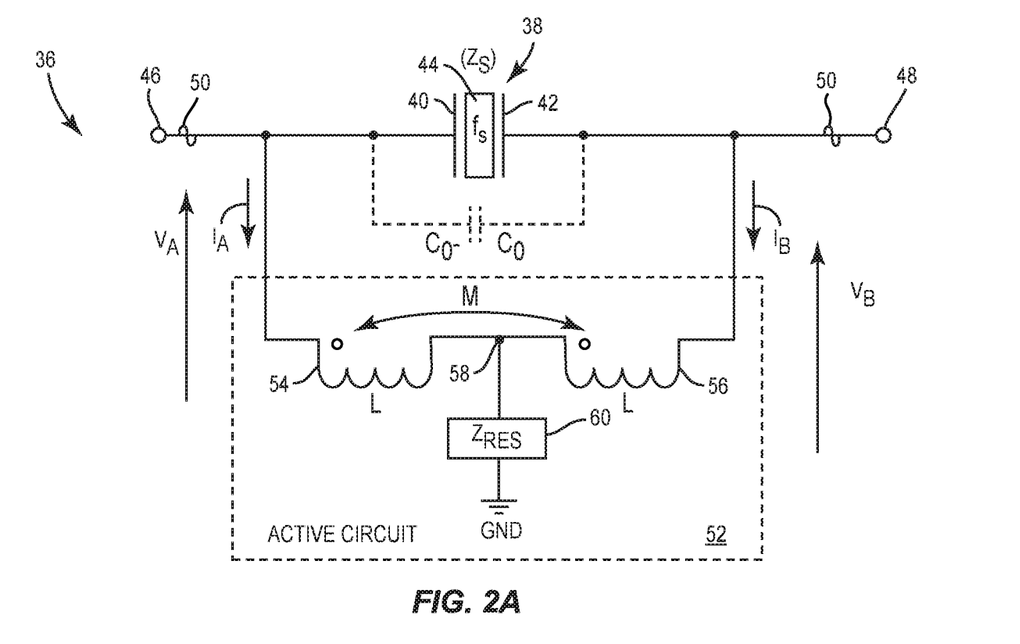
FIG. 2A is a schematic diagram of an exemplary acoustic resonator structure configured to cancel an electrical capacitance caused by an acoustic resonator.

In this regard, FIG. 2A is a schematic diagram of an exemplary acoustic resonator structure 36 configured to cancel an electrical capacitance $C_0$ caused by an acoustic resonator 38. In a non-limiting example, the acoustic resonator 38 is a BAW resonator that is identical to the BAW resonator 10 of FIG. 1A. The acoustic resonator 38 includes a first electrode 40, a second electrode 42, and a piezo layer 44 sandwiched between the first electrode 40 and the second electrode 42. The first electrode 40 is coupled to an input node 46 and the second electrode 42 is coupled to an output node 48. The acoustic resonator 38 may be configured to function as an RF filter to pass an RF signal 50 from the input node 46 to the output node 48 in the resonance frequency ($f_s$), while rejecting the RF signal 50 outside the resonance frequency ($f_s$). Like the BAW resonator 10 of FIG. 1A, the acoustic resonator 38 may cause the electrical capacitance $C_0$ between the input node 46 and the output node 48. As discussed above, the electrical capacitance $C_0$ can cause the acoustic resonator 38 to resonate at a secondary frequency different from the resonance frequency ($f_s$), which can lead to degradation in performance. As such, it may be desired to eliminate the electrical capacitance $C_0$ presented by the acoustic resonator 38.

In this regard, the acoustic resonator structure 36 is configured to include an active circuit 52. The active circuit 52 is coupled in parallel to the acoustic resonator 38 between the input node 46 and the output node 48. As discussed in detail below, the active circuit 52 can be configured to actively cancel the electrical capacitance $C_0$ between the input node 46 and the output node 48, thus helping to improve performance of the acoustic resonator 38.

In a non-limiting example, the active circuit 52 includes a first inductor 54 and a second inductor 56 that are coupled in series between the input node 46 and the output node 48. In this regard, the first inductor 54 and the second inductor 56 are coupled in parallel to the acoustic resonator 38. More specifically, the first inductor 54 is coupled between the input node 46 and an intermediate node 58 and the second inductor 56 is coupled between the intermediate node 58 and the output node 48.

Each of the first inductor 54 and the second inductor 56 is configured to have a self-inductance L. In a non-limiting example, the first inductor 54 can induce a first time-variant current $I_A$ when a first time-variant voltage $V_A$ is applied to the first inductor 54. The first time-variant current $I_A$ can induce a time-variant magnetic field (not shown) that is coupled to the second inductor 56. The amount of the magnetic field being coupled from the first inductor 54 to the second inductor 56 can be described based on a coupling factor k (0≤k≤1). When the coupling factor k equals zero (0), it means that none of the magnetic field is coupled from the first inductor 54 to the second inductor 56. In contrast, when the coupling factor k equals one (1), it means that all of the magnetic field is coupled from the first inductor 54 to the second inductor 56.

When the coupling factor k is greater than 0 (k>0), some or all of the magnetic field is coupled from the first inductor 54 to the second inductor 56. The time-variant magnetic field can cause a second time-variant voltage $V_B$, which can further induce a second time-variant current $I_B$, in the second inductor 56. Collectively, the first inductor 54 and the second inductor 56 present a mutual-inductance M between the input node 46 and the output node 48. In examples discussed hereinafter, the first inductor 54 and the second inductor 56 are negatively coupled. Accordingly, the mutual-inductance M of the first inductor 54 and the second inductor 56 can be expressed in equation (Eq. 1) on the next page.

$$M=-k*L \tag{Eq. 1}$$

The active circuit 52 also includes an impedance circuit 60. In a non-limiting example, the impedance circuit 60 is coupled between the intermediate node 58 and a ground (GND). The impedance circuit 60 can be configured to present a shunt impedance $Z_{RES}$ between the intermediate node 58 and the GND. As discussed in detail below, by configuring the impedance circuit 60 to actively generate the shunt impedance $Z_{RES}$ in relation to an inherent impedance $Z_S$ of the acoustic resonator 38, it may be possible to cause a negative capacitance $C_{0-}$ being created between the input node 46 and the output node 48. As a result, it may be possible to cancel the electrical capacitance $C_0$ caused by the acoustic resonator 38, thus helping to improve performance of the acoustic resonator structure 36.

Figure 2B:
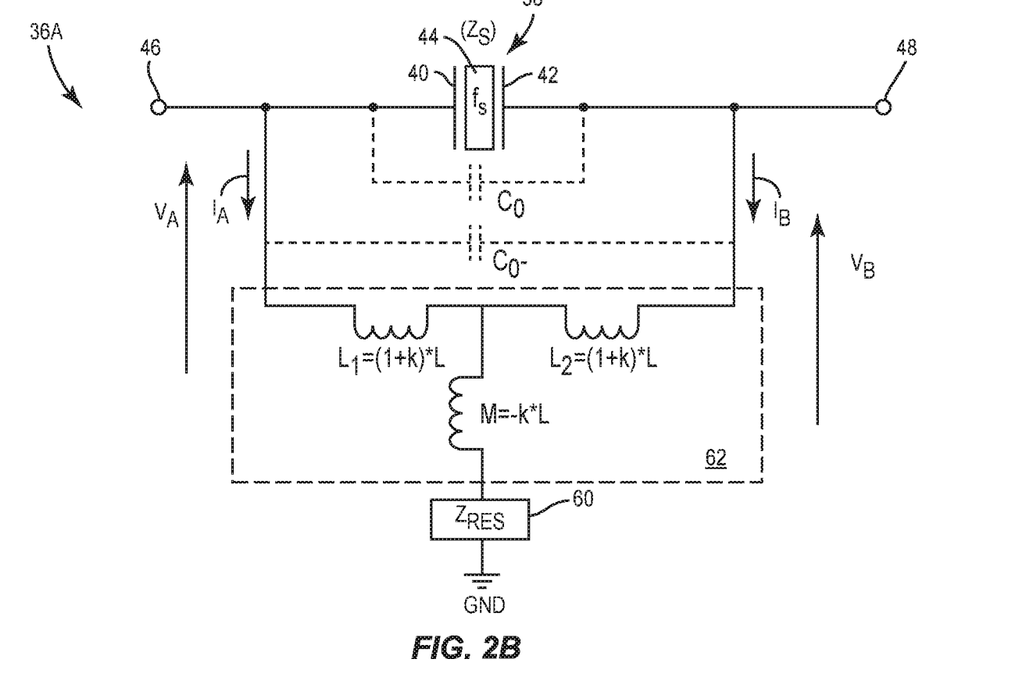
FIG. 2B is a schematic diagram of an exemplary acoustic resonator structure that is functionally equivalent to the acoustic resonator structure of FIG. 2A.

The first inductor 54 and the second inductor 56 may be represented by an equivalent T-network to help determine the shunt impedance $Z_{RES}$ that can cause the negative capacitance $C_{0-}$ to cancel the electrical capacitance $C_0$. In this regard, FIG. 2B is a schematic diagram of an exemplary acoustic resonator structure 36A that is functionally equivalent to the acoustic resonator structure 36 of FIG. 2A. Common elements between FIGS. 2A and 2B are shown therein with common element numbers and will not be re-described herein.

The acoustic resonator structure 36A includes a T-network 62 that is functionally equivalent to the first inductor 54 and the second inductor 56 in FIG. 2A. The T-network 62 includes a first self-inductance $L_1$, a second self-inductance $L_2$, and a mutual-inductance M that can be expressed by equation (Eq. 2) below.

$$L_1=L_2=(1+k)*L, M=-k*L \tag{Eq. 2}$$

In the equation (Eq. 2) above, L represents the respective self-inductance of the first inductor 54 and the second inductor 56 in FIG. 2A. Notably, the T-network 62 can be further transformed into a π-network to help determine the shunt impedance $Z_{RES}$ that can cause the electrical capacitance $C_0$ being canceled.

Figure 2C:
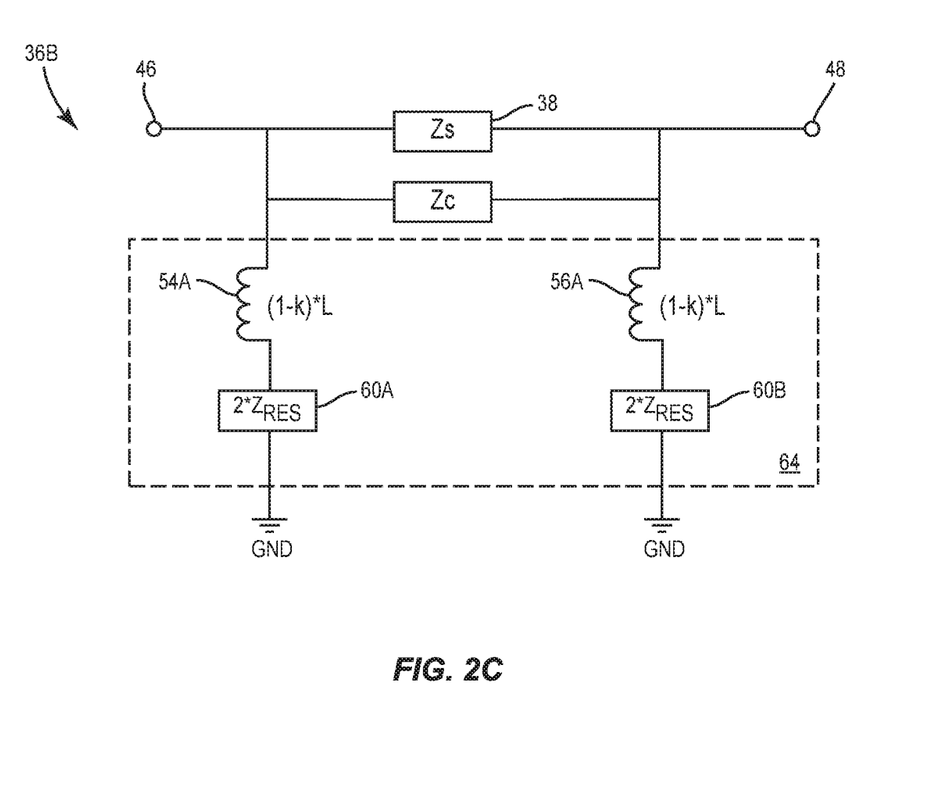
FIG. 2C is a schematic diagram of an exemplary acoustic resonator structure that is functionally equivalent to the acoustic resonator structures of FIGS. 2A and 2B.

In this regard, FIG. 2C is a schematic diagram of an exemplary acoustic resonator structure 36B that is functionally equivalent to the acoustic resonator structure 36 of FIG. 2A and the acoustic resonator structure 36A of FIG. 2B. Common elements between FIGS. 2A, 2B, and 2C are shown therein with common element numbers and will not be re-described herein.

The acoustic resonator structure 36B includes a π-network 64 that is functionally equivalent to the active circuit 52 in FIG. 2A. The π-network 64 includes a first inductor 54A and a second inductor 56A. Each of the first inductor 54A and the second inductor 56A has a respective self-inductance of $(1-k)*L$, wherein L represents the respective self-inductance of the first inductor 54 and the second inductor 56 in FIG. 2A. The π-network 64 includes a first impedance circuit 60A and a second impedance circuit 60B that collectively represent the impedance circuit 60 in FIGS. 2A and 2B. Each of the first impedance circuit 60A and the second impedance circuit 60B corresponds to a respective shunt impedance of $2*Z_{RES}$.

The π-network 64 can be configured to cause an impedance $Z_C$ between the input node 46 and the output node 48, in parallel to the inherent impedance $Z_S$ of the acoustic resonator 38 in FIGS. 2A and 2B. The impedance $Z_C$ may be expressed in equation (Eq. 3) below.

$$Z_C = ZL*(1+k)*[(2+ZL(1+k)/(-ZL*k+Z_{RES}) \tag{Eq. 3}$$
$$= j2L(1+k)\omega + [jL(1+k)\omega]^2/(Z_{RES}-jLk\omega)$$
$$= j2L(1+k)\omega - [L(1+k)\omega]^2/(Z_{RES}-jLk\omega)$$

In the equation above, ZL can be expressed as $jL\omega$. $\omega$ represents a pulsation of the acoustic resonator 38. The pulsation w can be further expressed as $2\pi f_S$, which corresponds to the resonance frequency ($f_S$) of the acoustic resonator 38. For the π-network 64 to cause the negative capacitance $C_{0-}$ to cancel the electrical capacitance $C_0$, the impedance $Z_C$ would need to be related to an equivalent impedance of the electrical capacitance $C_0$ as in equation (Eq. 4) below.

$$Z_C=-1/(jC_0\omega)=j/(C_0\omega) \tag{Eq. 4}$$

Thus, based on equations (Eq. 3 and Eq. 4), the following equations can be established.

$$j2L(1+k)\omega - [L(1+k)\omega]^2/(Z_{RES}-jLk\omega) = j/(C_0\omega)$$

$$j2L(1+k)\omega - j/(C_0\omega) = [L(1+k)\omega]^2/(Z_{RES}-jLk\omega)$$

$$(Z_{RES}-jLk\omega) = [L(1+k)\omega]^2/[j2L(1+k)\omega - j/(C_0\omega)]$$

$$(Z_{RES}-jLk\omega) = -jL(1+k)\omega/[2-1/L(1+k)C_0\omega^2]$$

$$Z_{RES} = j^*[Lk\omega - L(1+k)\omega/[2-1/(L(1+k)C_0\omega^2)]]$$

$$Z_{RES} = -j[(1-k^2)LC_0\omega^2+k]/[2(1+k)C_0\omega - 1/(L\omega)]$$

$$Z_{RES} = -jL\omega[(1-k^2)LC_0\omega^2+k]/[2(1+k)LC_0\omega^2-1]$$

As discussed above, $w=2\pi f_S$. In this regard, when the resonance frequency ($f_S$) is above a certain threshold, $2(1+k)LC_0\omega^2$ would be far greater than 1 (e.g., $2(1+k)LC_0\omega^2 \gg 1$). As such, the shunt impedance $Z_{RES}$ may be approximated as equation (Eq. 5) below.

$$\begin{aligned}Z_{RES} &\approx -jL\omega[(1-k^2)LC_0\omega^2+k]/[2(1+k)LC_0\omega^2] \quad \text{(Eq. 5)}\\ &\approx -j[(1-k)L\omega/2 + k/2(1+k)C_0\omega]\\ &\approx -j(1-k)L/2\omega + k/(j2(1+k)C_0\omega)\end{aligned}$$

The equation (Eq. 5) can be seen as including an equivalent negative inductance term $(1-k)/2L$ and an equivalent positive capacitance term $2C_0(1+k)/k$. In this regard, to create the negative capacitance $C_{0-}$ to cancel the electrical capacitance $C_0$ between the input node 46 and the output node 48, the active circuit 52 in FIG. 2A can be further configured to generate the shunt impedance $Z_{RES}$ that includes the equivalent negative inductance term $(1-k)/2L$ and the equivalent positive capacitance term $2C_0(1+k)/k$.

Figure 3:
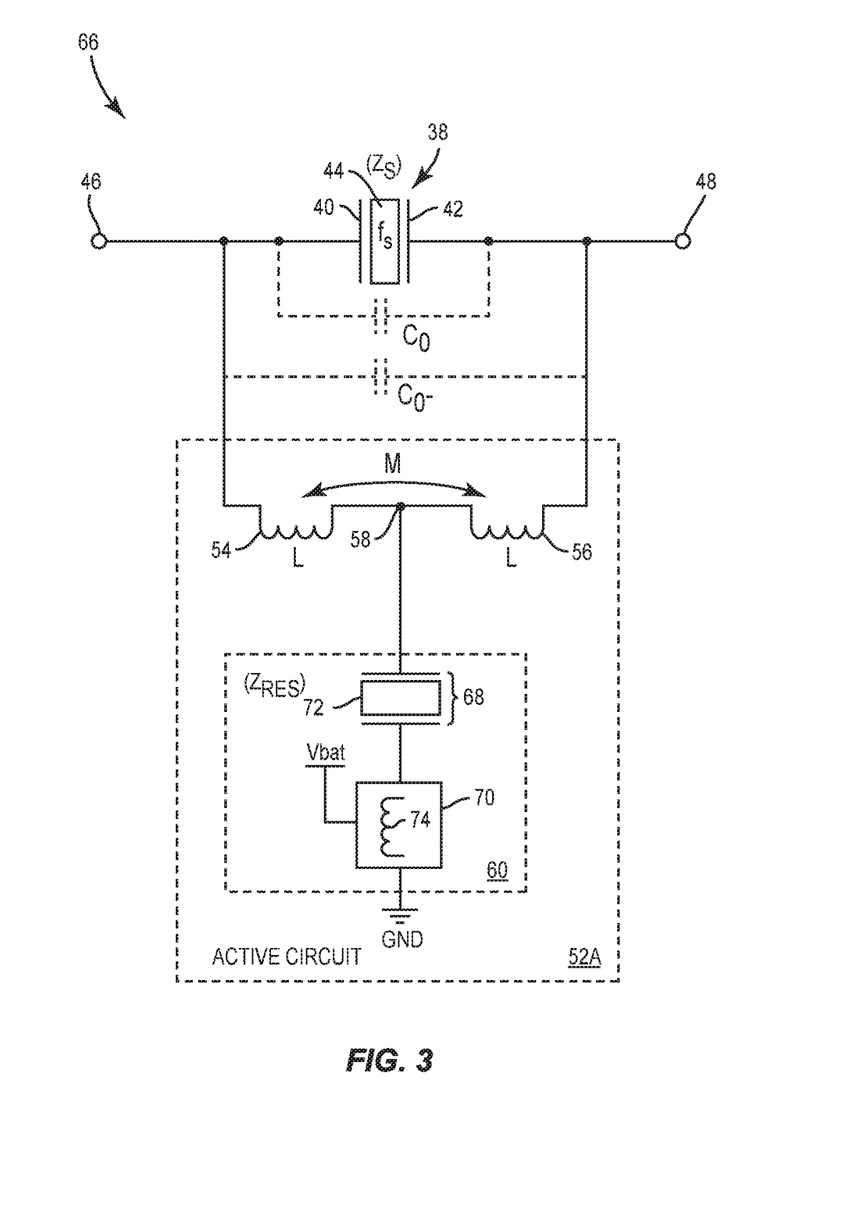
FIG. 3 is a schematic diagram of an exemplary acoustic resonator structure configured according to an embodiment of the present disclosure to actively cancel an electrical capacitance caused by an acoustic resonator.

In this regard, FIG. 3 is a schematic diagram of an exemplary acoustic resonator structure 66 configured according to an embodiment of the present disclosure to include a passive impedance circuit 68 and an active impedance circuit 70 for generating the shunt impedance $Z_{RES}$ to cancel the electrical capacitance $C_0$ in accordance to the equation (Eq. 5) above. Common elements between FIGS. 2A and 3 are shown therein with common element numbers and will not be re-described herein.

In one non-limiting example, the passive impedance circuit 68 can be coupled directly to the intermediate node 58 and the active impedance circuit 70 can be coupled between the passive impedance circuit 68 and the GND. In another non-limiting example, the active impedance circuit 70 can be coupled directly to the intermediate node 58 and the passive impedance circuit 68 can be coupled between the active impedance circuit 70 and the GND.

The passive impedance circuit 68 can be configured to include at least one acoustic resonator 72 (e.g., a BAW resonator) and/or at least one capacitor (not shown). The passive impedance circuit 68 may be configured to generate the equivalent positive capacitance term $2C_0(1+k)/k$ in the equation (Eq. 5).

The active impedance circuit 70 can be configured to include at least one inductor 74. In contrast to the passive impedance circuit 68, the inductor 74 is powered by a battery voltage $V_{bat}$. The active impedance circuit 70 can be configured to generate the equivalent negative inductance term $(1-k)/2L$ in the equation (Eq. 5). Collectively, the passive impedance circuit 68 and the active impedance circuit 70 can generate the shunt impedance $Z_{RES}$ that causes the negative capacitance $C_{0-}$ to cancel the electrical capacitance $C_0$.

Figure 4:
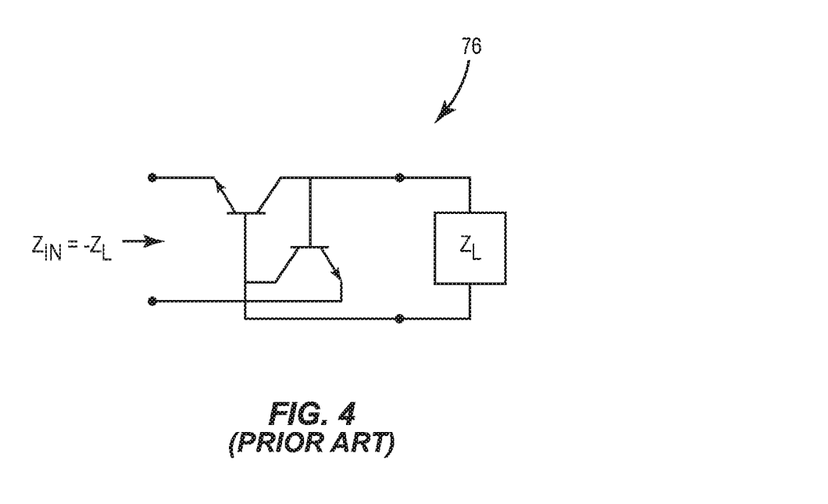
FIG. 4 is a schematic diagram of an exemplary existing circuit for generating a negative inductance.

Alternative to employing the inductor 74, there may exist different ways to generate a negative inductance. In this regard, FIG. 4 is a schematic diagram of an exemplary existing circuit 76 for generating a negative inductance.

Figure 5:
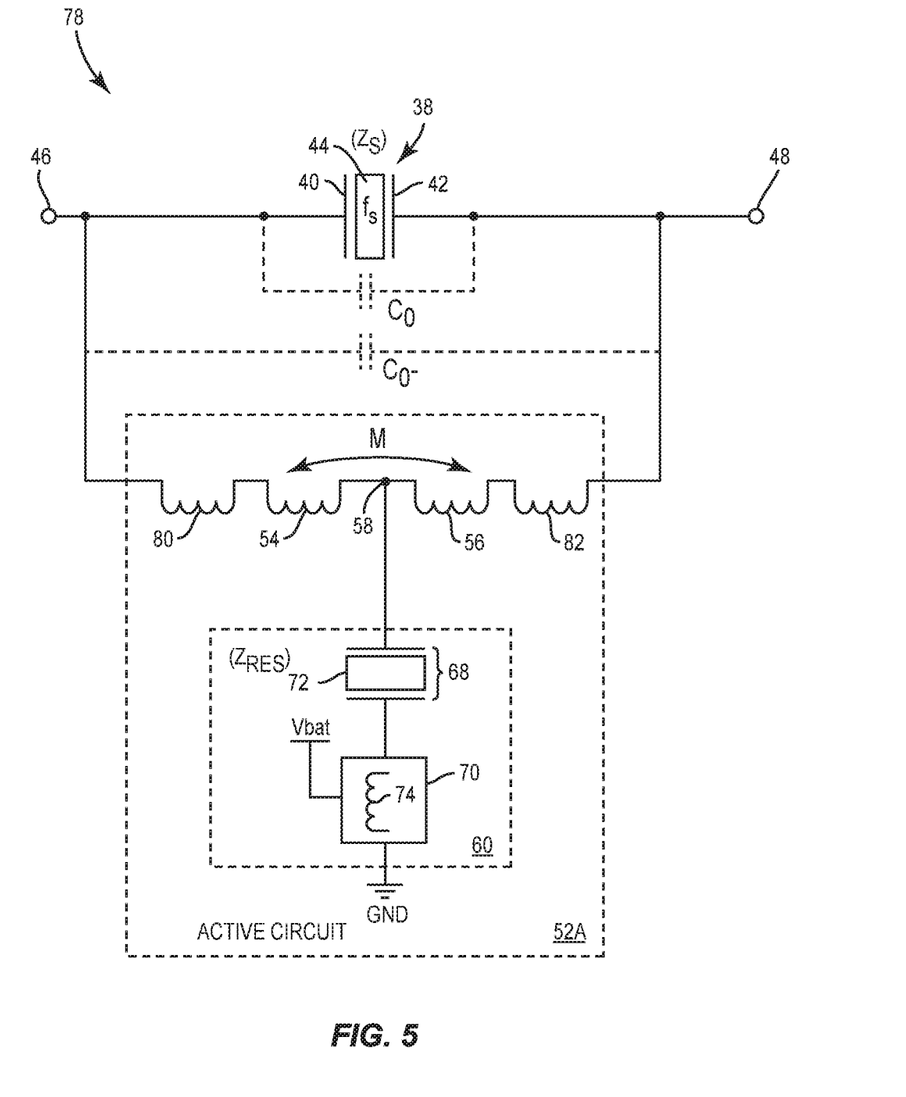
FIG. 5 is a schematic diagram of an exemplary acoustic resonator structure configured according to another embodiment of the present disclosure to actively cancel an electrical capacitance caused by an acoustic resonator.

FIG. 5 is a schematic diagram of an exemplary acoustic resonator structure 78 configured according to another embodiment of the present disclosure to cancel the electrical capacitance $C_0$. Common elements between FIGS. 3 and 5 are shown therein with common element numbers and will not be re-described herein.

The acoustic resonator structure 78 includes an active circuit 52A that includes the first inductor 54, the second inductor 56, and the impedance circuit 60. In addition, the active circuit 52A includes a first auxiliary inductor 80 coupled in series between the input node 46 and the first inductor 54. The active circuit 52A further includes a second auxiliary inductor 82 coupled in series between the output node 48 and the second inductor 56.

The first auxiliary inductor 80 may be configured to generate a first auxiliary magnetic field (not shown) that cancels a portion of the magnetic field generated by the first inductor 54 without affecting the magnetic field being coupled from the first inductor 54 to the second inductor 56. Likewise, the second auxiliary inductor 82 may be configured to generate a second auxiliary magnetic field (not shown) that cancels a portion of the magnetic field generated by the second inductor 56 without affecting the magnetic field being coupled between the first inductor 54 and the second inductor 56.

In this regard, the first auxiliary inductor 80 and the second auxiliary inductor 82 are configured to cancel a portion of the respective self-inductance L of the first inductor 54 and the second inductor 56, but not change the mutual-inductance M between the first inductor 54 and the second inductor 56. As a result, it may be possible to cause the coupling factor k between the first inductor 54 and the second inductor 56 to be substantially close to 1.

Those skilled in the art will recognize improvements and modifications to the embodiments of the present disclosure. All such improvements and modifications are considered within the scope of the concepts disclosed herein and the claims that follow.

What is claimed is:

1. An acoustic resonator structure comprising:
   an input node and an output node;
   an acoustic resonator coupled between the input node and the output node and configured to resonate in a resonance frequency to pass a radio frequency (RF) signal from the input node to the output node; and
   an active circuit coupled in parallel to the acoustic resonator between the input node and the output node and configured to cause a negative capacitance being generated between the input node and the output node, wherein the active circuit comprises an impedance circuit comprising a passive impedance circuit and an active impedance circuit, wherein the active impedance circuit comprises at least one inductor coupled to a battery.

2. The acoustic resonator structure of claim 1 wherein:
   the acoustic resonator causes an electrical capacitance between the input node and the output node in parallel to the acoustic resonator; and the active circuit is further configured to cause the negative capacitance to be generated to cancel the electrical capacitance between the input node and the output node.

3. The acoustic resonator structure of claim 1 wherein the active circuit comprises:
a first inductor and a second inductor coupled in series between the input node and the output node;
wherein the impedance circuit is coupled to the first inductor and the second inductor and configured to cause the negative capacitance to be generated between the input node and the output node.

4. The acoustic resonator structure of claim 3 wherein the first inductor and the second inductor are configured to be negatively coupled.

5. The acoustic resonator structure of claim 3 wherein:
the acoustic resonator causes an electrical capacitance between the input node and the output node in parallel to the acoustic resonator; and
the impedance circuit is further configured to cause the negative capacitance to be generated to cancel the electrical capacitance.

6. The acoustic resonator structure of claim 5 wherein:
the first inductor is coupled between the input node and an intermediate node;
the second inductor is coupled between the intermediate node and the output node; and
the impedance circuit is coupled between the intermediate node and a ground.

7. The acoustic resonator structure of claim 6 wherein the passive impedance circuit and the active impedance circuit are coupled in series between the intermediate node and the ground, wherein the passive impedance circuit and the active impedance circuit are configured to collectively cause the negative capacitance to be generated between the input node and the output node.

8. The acoustic resonator structure of claim 7 wherein:
the passive impedance circuit is coupled to the intermediate node; and
the active impedance circuit is coupled between the passive impedance circuit and the ground.

9. The acoustic resonator structure of claim 7 wherein:
the active impedance circuit is coupled to the intermediate node; and
the passive impedance circuit is coupled between the active impedance circuit and the ground.

10. The acoustic resonator structure of claim 7 wherein the passive impedance circuit comprises at least one acoustic resonator.

11. The acoustic resonator structure of claim 7 wherein the passive impedance circuit comprises at least one capacitor.

12. The acoustic resonator structure of claim 7 wherein the impedance circuit is further configured to generate a shunt impedance having a positive capacitance term and a negative inductance term.

13. The acoustic resonator structure of claim 12 wherein the impedance circuit is further configured to generate the shunt impedance to equal approximately an equivalent impedance of the electrical capacitance.

14. The acoustic resonator structure of claim 13 wherein the shunt impedance is expressed approximately as $[-j(1-k)L/2(2\pi f)+k/(j2(1+k)C_0(2\pi f_S))]$, wherein:
L represents a respective inductance of the first inductor and the second inductor;
$C_0$ represents the electrical capacitance caused by the acoustic resonator;
k represents a coupling factor between the first inductor and the second inductor; and
$f_S$ represents the resonance frequency of the acoustic resonator.

15. The acoustic resonator structure of claim 12 wherein:
the passive impedance circuit is configured to generate the positive capacitance term; and
the active impedance circuit is configured to generate the negative inductance term.

16. The acoustic resonator structure of claim 12 wherein the positive capacitance term is mathematically expressed as $2C_0(1+k)/k$, wherein:
$C_0$ represents the electrical capacitance caused by the acoustic resonator; and
k represents a coupling factor between the first inductor and the second inductor.

17. The acoustic resonator structure of claim 12 wherein the negative inductance term is mathematically expressed as $(1-k)L/2$, wherein:
L represents a respective inductance of the first inductor and the second inductor; and
k represents a coupling factor between the first inductor and the second inductor.

18. The acoustic resonator structure of claim 3 wherein the active circuit further comprises:
a first auxiliary inductor coupled between the input node and the first inductor; and
a second auxiliary inductor coupled between the output node and the second inductor.

19. The acoustic resonator structure of claim 18 wherein the first auxiliary inductor and the second auxiliary inductor are configured to cancel at least a portion of a respective self-inductance of the first inductor and the second inductor without affecting a mutual-inductance between the first inductor and the second inductor.

* * * * *